United States Patent
Takei et al.

(10) Patent No.: US 9,310,404 B2
(45) Date of Patent: Apr. 12, 2016

(54) POWER MEASUREMENT SYSTEM AND POWER TEMPERATURE CONVERTER

(71) Applicant: FUJITSU LIMITED, Kawasaki-shi, Kanagawa (JP)

(72) Inventors: Fumio Takei, Isehara (JP); Kazushi Uno, Atsugi (JP); Takeo Kasajima, Machida (JP); Takahiro Kashikawa, Hadano (JP); Minoru Ishinabe, Atsuji (JP)

(73) Assignee: FUJITSU LIMITED, Kawasaki (JP)

( * ) Notice: Subject to any disclaimer, the term of this patent is extended or adjusted under 35 U.S.C. 154(b) by 453 days.

(21) Appl. No.: 13/753,877

(22) Filed: Jan. 30, 2013

(65) Prior Publication Data

US 2013/0141078 A1 Jun. 6, 2013

Related U.S. Application Data

(63) Continuation of application No. PCT/JP2010/063154, filed on Aug. 4, 2010.

(51) Int. Cl.
*G01R 21/02* (2006.01)
*G01R 21/04* (2006.01)
*H02J 7/00* (2006.01)

(52) U.S. Cl.
CPC ............. *G01R 21/02* (2013.01); *G01R 21/04* (2013.01); *H02J 7/0068* (2013.01)

(58) Field of Classification Search
None
See application file for complete search history.

(56) References Cited

U.S. PATENT DOCUMENTS

| | | | |
|---|---|---|---|
| 4,510,482 A | | 4/1985 | McClanahan |
| 5,109,595 A | * | 5/1992 | Wickersheim et al. .......... 29/600 |
| 5,110,216 A | * | 5/1992 | Wickersheim et al. ....... 374/122 |
| 5,696,863 A | * | 12/1997 | Kleinerman ......... G01D 5/3538 |
| | | | 250/227.11 |

FOREIGN PATENT DOCUMENTS

| | | |
|---|---|---|
| JP | 59-116056 | 7/1984 |
| JP | 60-60564 | 4/1985 |
| JP | 2000-241463 | 9/2000 |
| JP | 2004-125410 A1 | 4/2004 |
| JP | 2005-43231 A1 | 2/2005 |
| JP | 2006-46922 A1 | 2/2006 |
| JP | 2006-84176 A1 | 3/2006 |

OTHER PUBLICATIONS

International Search Report for International Application No. PCT/JP2010/063154 dated Nov. 9, 2010.

(Continued)

*Primary Examiner* — Paresh Patel
(74) *Attorney, Agent, or Firm* — Kratz, Quintos & Hanson, LLP (57) ABSTRACT

A power measurement system includes: a power temperature converter attached to a power supply line of an electric instrument and having a temperature changed corresponding to a current flowing through the power supply line; a temperature measurement apparatus configured to measure the temperature of the power temperature converter; and an analyzer configured to analyze power consumed by the electric instrument by using a measurement result of the temperature of the power temperature converter obtained by the temperature measurement apparatus.

12 Claims, 6 Drawing Sheets (56) References Cited

OTHER PUBLICATIONS

Office Action of Chinese Patent Application No. 201080068390.6 dated May 19, 2014 with Full English translation.

Surface Temperature Monitor of Electric Cable and Real-time Current Calculation System:, Youxiang Yan, et al, Supply of Power, vol. 25, No. 5, pp. 48-50 and 73, Oct. 31, 2008 with Translation of Abstract.

* cited by examiner

POWER MEASUREMENT SYSTEM AND POWER TEMPERATURE CONVERTER

CROSS-REFERENCE TO RELATED APPLICATION

This application is a continuation of International Patent Application No. PCT/JP2010/063154 filed Aug. 4, 2010 and designated the U.S., the entire contents of which are incorporated herein by reference.

FIELD

The embodiments discussed herein relate to a power measurement system and a power temperature converter.

BACKGROUND

In recent years, an amount of data handled by a computer has grown enormously due to rapid spread of Internet environments including the broadband. In order to efficiently process a large amount of data, data centers are rapidly increasing where numerous computers (servers) are installed in one room for the purpose of collective management.

Numerous servers are in operation in a data center and each of the servers generates heat corresponding to its power consumption. In such a data center, in order to avoid erroneous operations or failures of the servers attributed to the heat generated by the servers, air conditioners are installed in a server room to introduce low-temperature air to the servers, thereby preventing overheating of the servers.

Patent Document 1: Japanese Laid-open Patent Publication No. 2004-125410
Patent Document 2: Japanese Laid-open Patent Publication No. 2005-43231
Patent Document 3: Japanese Laid-open Patent Publication No. 2006-46922
Patent Document 4: Japanese Laid-open Patent Publication No. 2006-84176

In the meantime, energy conservation is preferred in every aspect of society in the light of prevention of global warming. Since a data center consumes enormous electric power for operating an air-conditioning system including air conditioners, efficient operation of the air-conditioning system is preferred.

In order for the efficient operation of the air-conditioning system, it is preferable to measure power consumption of servers and to feed such information back to control of the air-conditioning system. A current sensor using a shunt resistor or an AC current sensor using a current transformer has long been employed for measuring power consumption of an electric instrument.

However, implementation of measurement of power consumption of numerous electric instruments (the servers and the like) with the current sensors uses a large number of the current sensors as well as a large number of wires for connecting the current sensors to a measurement apparatus. As a consequence, not only costs for the current sensors and the measurement apparatus but also costs for arrangement of the current sensors (inclusive of installation of the wires) and costs for maintenance also become large. Accordingly, it is impractical to fit the above-mentioned current sensors respectively on the numerous electric instruments and to individually measure the power consumption of the electric instruments.

SUMMARY

According to an aspect, provided is a power measurement system including: a power temperature converter attached to a power supply line of an electric instrument and having a temperature changed corresponding to a current flowing through the power supply line; a temperature measurement apparatus configured to measure the temperature of the power temperature converter; and an analyzer configured to analyze power consumed by the electric instrument by using a measurement result of the temperature of the power temperature converter obtained by the temperature measurement apparatus.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Embodiments will be described below with reference to the accompanying drawings.

First Embodiment

Figure 1:
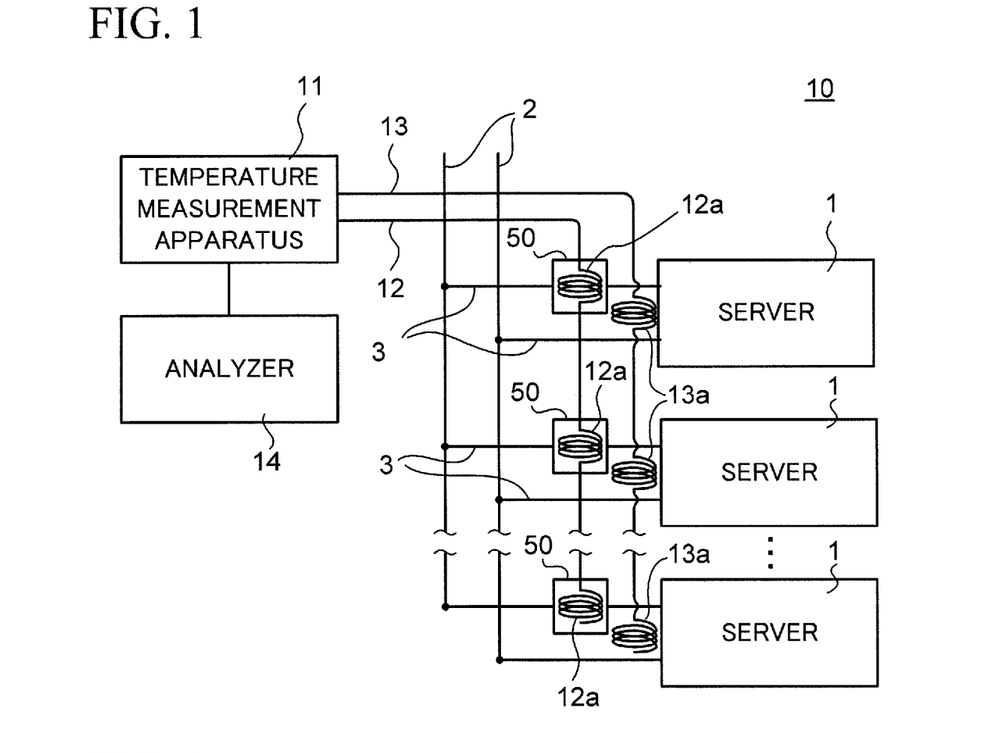
FIG. 1 is a block diagram of a power measurement system according to a first embodiment.

FIG. 1 is a block diagram of a power measurement system according to a first embodiment.

A plurality of servers 1 are installed in a server room of a data center. Power supply lines 3 for supplying electric power to these servers 1 are connected to common power supply lines 2. A power temperature converter 50 is fitted on the power supply line 3 of each server 1. The power temperature converters 50 generate heat corresponding to currents flowing through the power supply lines 3. Details of the power temperature converter 50 will be described later.

A temperature measurement apparatus 11 uses optical fibers 12 and 13 as temperature sensors and measures temperatures of places where the optical fibers 12 and 13 are installed. Specifically, the temperature measurement apparatus 11 emits laser beams into the optical fibers 12 and 13 at regular time intervals, detects backscattered light (Raman scattered light) generated inside the optical fibers 12 and 13, and measures temperature distribution in the longitudinal direction of the optical fibers 12 and 13.

The optical fiber 12 is installed in such a manner as to come into contact with the power temperature converters 50, and detects the temperatures of the power temperature converters 50. Meanwhile, the optical fiber 13 is installed in such a manner as to pass positions slightly away from the power temperature converters 50, and detects temperatures (ambient temperatures) of the places where the power temperature converters 50 are arranged.

The analyzer 14 analyzes a temperature measurement result outputted from the temperature measurement apparatus 11 and thereby calculates power consumption of each of the servers 1.

Figure 2:
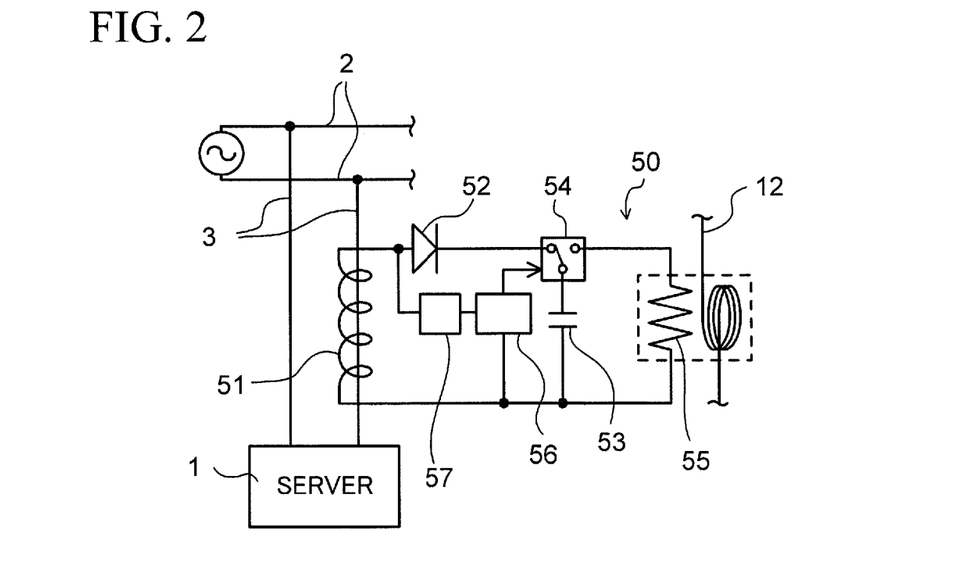
FIG. 2 is a circuit diagram depicting an example of a power temperature converter of the first embodiment.

FIG. 2 is a circuit diagram depicting an example of the power temperature converter 50. As depicted in FIG. 2, the power temperature converter 50 includes a current coil 51, a rectifier element 52, a capacitor 53, a switch element 54, a resistance heating element (a temperature change element) 55, a discharge control unit 56, and a power supply unit 57.

The current coil 51 is attached to the power supply line 3 and generates an electromotive force (an induced electromotive force) corresponding to an AC current flowing through the power supply line 3. A commercially available split-type AC current sensor is used as the current coil 51, for example. Here, a current transformer may be used instead of the current coil 51 and an electromotive force corresponding to the AC current flowing through the power supply line 3 may be obtained with this current transformer.

The rectifier element 52 rectifies the electromotive force (the AC current) generated by the current coil 51. A Schottky barrier diode is preferably used as the rectifier element 52 because of its small voltage drop. The current rectified by the rectifier element 52 is supplied to the capacitor 53 via the switch element 54, whereby charges are accumulated in the capacitor 53.

The capacitor 53 preferably has a large capacity. For example, an electric double-layer capacitor having a capacity of about 1 F (farad) is used, for example. The switch element 54 is operated by a signal from the discharge control unit 56. This switch element 54 is formed of a MOS transistor, for example.

The resistance heating element 55 is configured to generate heat when the charges accumulated in the capacitor 53 flow therein, and is formed of a nickel thin film, for example. A resistance value of the resistance heating element 55 is set in a range of about 50Ω to 200Ω, for example. Here, in order to measure the temperature of the resistance heating element 55 at high accuracy, a predetermined length of the optical fiber 12 is preferably wound around in the vicinity of the resistance heating element 55 as depicted in FIG. 2.

The discharge control unit 56 is formed by use of a timer IC or a one-chip microcontroller, for example, and switches the flow of the charges by controlling the switch element 54 at regular time intervals. Specifically, the discharge control unit 56 electrically connects the current coil 51 to the capacitor 53 during a charging period and accumulates the charges in the capacitor 53 as described later. Meanwhile, during a discharging period, the discharge control unit 56 electrically connects the capacitor 53 to the resistance heating element 55 so as to cause the charges accumulated in the capacitor 53 to flow in the resistance heating element 55.

The power supply unit 57 is configured to generate power for driving the discharge control unit 56 from the induced electromotive force generated by the current coil 51, and includes a rectifier element and a constant voltage circuit, for example. A photovoltaic cell configured to generate power using illumination in the server room, a thermoelectric conversion element configured to generate power using a temperature difference, a piezoelectric element configured to generate power using vibration in the server room, or the like may be used instead of the power supply unit 57 configured to use the electromotive force generated by the current coil 51.

Figure 3:
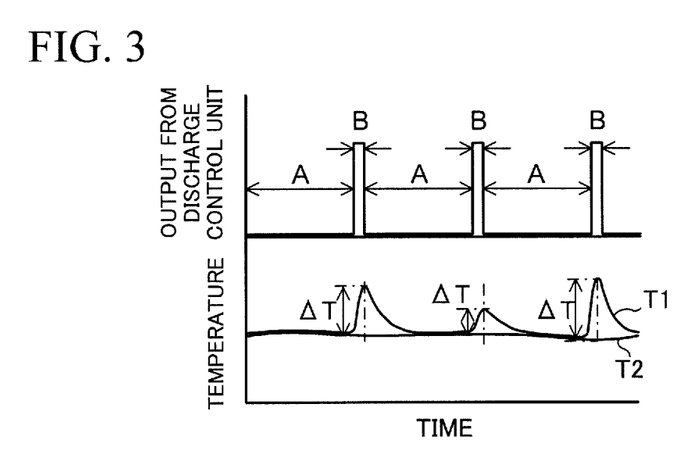
FIG. 3 is a timing chart for explaining an operation of the power temperature converter of the first embodiment.

FIG. 3 is a timing chart for explaining an operation of the power temperature converter 50. In FIG. 3, a view on an upper side indicates output from the discharge control unit 56 while a view on a lower side indicates variations with time of a temperature T1 of the resistance heating element 55 measured with the optical fiber 12 and of an ambient temperature T2 in the neighborhood of the resistance heating element 55 measured with the optical fiber 13.

As indicated in FIG. 3, the output from the discharge control unit 56 is "L" (a Low level) in a charging period (each period indicated with an arrow A), in which the switch element 54 electrically connects the current coil 51 to the capacitor 53. Thus, the current generated by the current coil 51 flows to the capacitor 53 via the rectifier element 52 and the switch element 54, and the charges are accumulated in the capacitor 53. The amount of charges accumulated in the capacitor 53 represents a value which corresponds to the current flowing through the power supply line 3 of the server 1. Specifically, the larger the power consumption of the server 1 is, the larger the amount of charges accumulated in the capacitor 53 is.

In a discharging period (each period indicated with an arrow B) after the charging period, the output from the discharge control unit 56 becomes "H" (a High level). Accordingly, the switch element 54 is activated, whereby the current coil 51 is electrically disconnected from the capacitor 53, and the capacitor 53 is electrically connected to the resistance heating element 55. Then, the charges accumulated in the capacitor 53 flow to the resistance heating element 55 and the temperature of the resistance heating element 55 rises as a consequence. At this time, the temperature of the resistance heating element 55 depends on the amount of charges accumulated in the capacitor 53. In other words, the larger the power consumption of the server 1 is, the higher the temperature of the resistance heating element 55 is. In FIG. 3, code $\Delta T$ denotes a temperature rise amount of the resistance heating element 55, i.e., a difference between the temperature T1 (a peak value) of the resistance heating element 55 measured with the optical fiber 12 and the ambient temperature T2 measured with the optical fiber 13.

After the discharging period, the resistance heating element 55 is electrically disconnected from the capacitor 53 by the switch element 54. Then, the capacitor 53 is electrically connected to the current coil 51 and the charges are accumulated in the capacitor 53 again. Thereafter, the capacitor 53 repeats the charge and discharge at regular time intervals.

Figure 4:
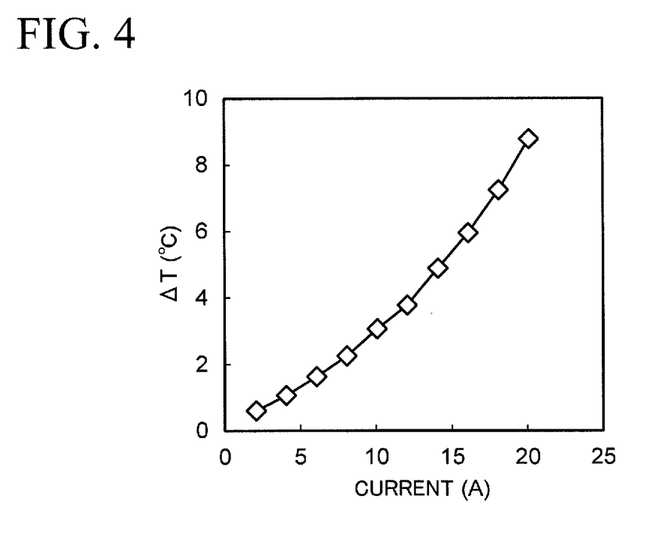
FIG. 4 is a view indicating a result of investigation of a relation between a current flowing through an electric instrument and a temperature rise amount $\Delta T$.

FIG. 4 is a view indicating a result of investigation of a relation between a current flowing through an electric instrument and the temperature rise amount $\Delta T$, with the current on abscissa and the temperature rise amount $\Delta T$ on the ordinate. As indicated in FIG. 4, the larger the current flowing through the electric instrument is, the larger the temperature rise amount $\Delta T$ is.

A calibration table created from data as indicated in FIG. 4 is stored in the analyzer 14 in advance. The analyzer 14 calculates the current which flows in each electric instrument by using the temperature measurement result outputted from the temperature measurement apparatus 11, and also calculates the power consumption by using the current.

Figure 5:
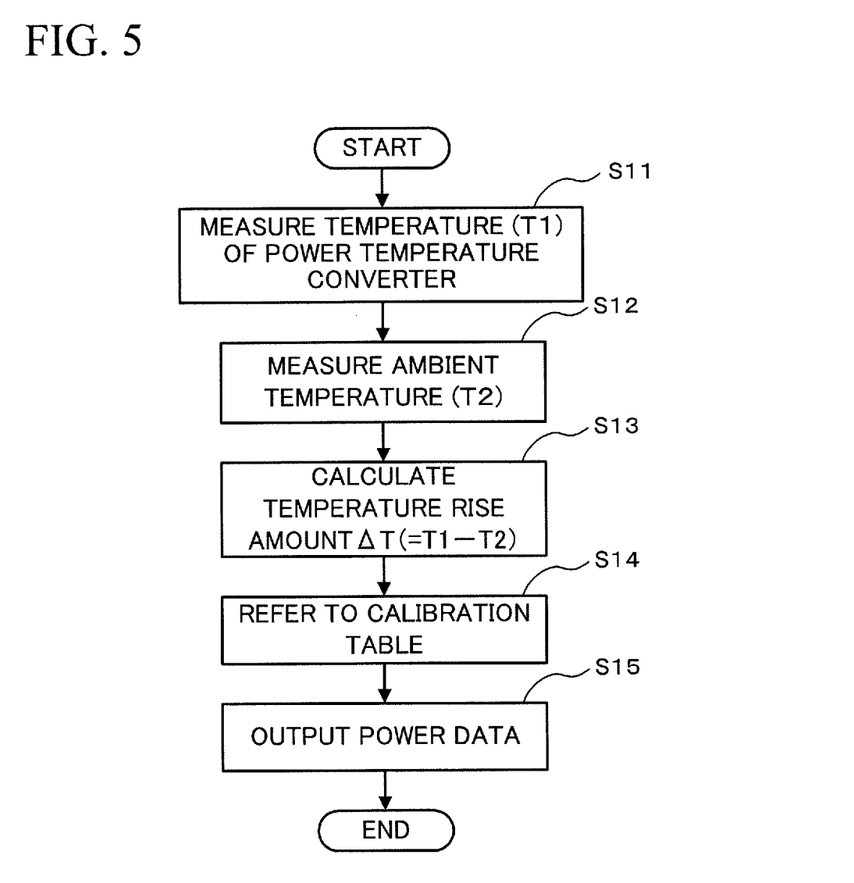
FIG. 5 is a flowchart for explaining an operation of the power measurement system according to the first embodiment.

FIG. 5 is a flowchart for explaining an operation of the power measurement system 10 according to the embodiment.

First, in step S11, the temperature measurement apparatus 11 measures the temperature T1 of the power temperature converter 50, which is provided on each server 1, by using the first optical fiber 12.

Next, in step S12, the temperature measurement apparatus 11 measures the ambient temperature T2 in the neighborhood of each power temperature converter 50 by using the second optical fiber 13.

Then, in step S13, the analyzer 14 receives the temperature measurement result from the temperature measurement apparatus 11 and calculates the temperature rise amount $\Delta T$ (=T1−T2) for each power temperature converter 50.

Subsequently, in step S14, the analyzer 14 refers to the calibration table and converts the temperature rise amounts $\Delta T$ into the electric power. Then, in step S15, the analyzer 14 outputs such data (power data). The data to be outputted from the analyzer 14 are used, for example, for adjusting temperature settings of air conditioners, controlling amounts of blow of cool air, controlling the numbers of revolutions of fans installed in various locations in the data center, and so forth.

As described above, the power measurement system 10 of this embodiment is provided with the power temperature converters 50 each attached to the power cable 3 of each server 1, and is configured to measure temperature changes of the power temperature converters 50 by using the optical fibers 12 and 13. When current sensors are provided on the respective servers 1 and results of current measurement are transmitted in the form of electric signals to a measurement apparatus, numerous signal wires for connecting the servers to the measurement apparatus are used. On the other hand, this embodiment does not use signal wires other than the optical fibers 12 and 13. Hence, the system is constructed easily while being less expense for maintenance.

Moreover, each power temperature converter 50 used in this embodiment accumulates the charges, which are generated by the induced electromotive force attributed to the current flowing through the power cables 3, into the capacitor 53 and feeds the charges accumulated in the capacitor 53 to the resistance heating element 55 so as to cause the resistance heating element 55 to generate the heat. For this reason, the power consumed by the power temperature converters 50 is small so that the power consumption of the entire power measurement system 10 may be suppressed even in the case of measuring the power consumption of the numerous servers 1.

Furthermore, in the power measurement system according to the embodiment, the power consumption of each server 1 is calculated by measuring the temperature of each of the power temperature converters 50 attached to the power cable 3 of the server 1 using the optical fibers 12 and 13. For this reason, the power consumption of the power measurement system does not change if the number of the servers 1 (the number of the power temperature converters 50) is increased.

Here, the power consumption of the temperature measurement apparatus (the Raman scattered light-type temperature measurement apparatus) is about 200 W, and the power temperature converter 50 consumes little power. Accordingly, an increase in power consumption of the data center attributed to introduction of the power measurement system 10 is negligible. In the meantime, the power which is equal to or more than the power consumed by the power measurement system 10 of this embodiment may be saved by means of detecting the changes in power consumption of each server 1 with the power measurement system and appropriately setting the air conditioning system in accordance with the changes.

In this embodiment, the temperatures of the power temperature converters 50 are measured by using the optical fiber 12 and the ambient temperatures are measured by using the optical fiber 13. Instead, the temperatures of the power temperature converters 50 and the ambient temperatures may be measured by using one optical fiber. For example, the temperatures of the power temperature converters 50 may be measured on a forward route of an optical fiber and the ambient temperatures may be measured on a return route of the optical fiber. Alternatively, the ambient temperatures do not have to be measured when the ambient temperatures barely change and when the ambient temperatures are known in advance.

(Experiment 1)

In Experiment 1, a relation between a current flowing through an electronic load device and a temperature rise of the power temperature converter 50 is examined by using the power temperature converter 50, the optical fibers 12 and 13, and the temperature measurement apparatus 11.

Multimode graded-index optical fibers HFR-Z2-1 (manufactured by Furukawa Electric Co., Ltd. with polyurethane coating) are used as the optical fibers 12 and 13. Meanwhile, a Raman scattered light-type temperature measurement apparatus DTS800M (manufactured by SENSA) is used as the temperature measurement apparatus 11.

A split-type AC current sensor is used as the current coil 51 of the power temperature converter 50 and an electric double-layer capacitor having a capacity of 1 F is used as the capacitor 53. Moreover, a nickel thin-film heater having a resistance value of about 100Ω is used as the resistance heating element 55 and a Schottky barrier diode is used as the rectifier element 52. Further, a one-chip microcontroller PIC12F683 (manufactured by Microchip Technology Inc.) is used as the discharge control unit 56. Here, the charging period is set to about 10 minutes and the discharging period is set to about 1 minute.

The power temperature converter 50 is attached to an electronic load device capable of being set to a given consumption current value, and a relation between a current flowing through the electronic load device and the temperature rise amount $\Delta T$ of the power temperature converter 50 is measured. As a result, the relation between the temperature rise amount $\Delta T$ and the current flowing through the electronic load device turns out as indicated in FIG. 4.

Second Embodiment

Figure 6:
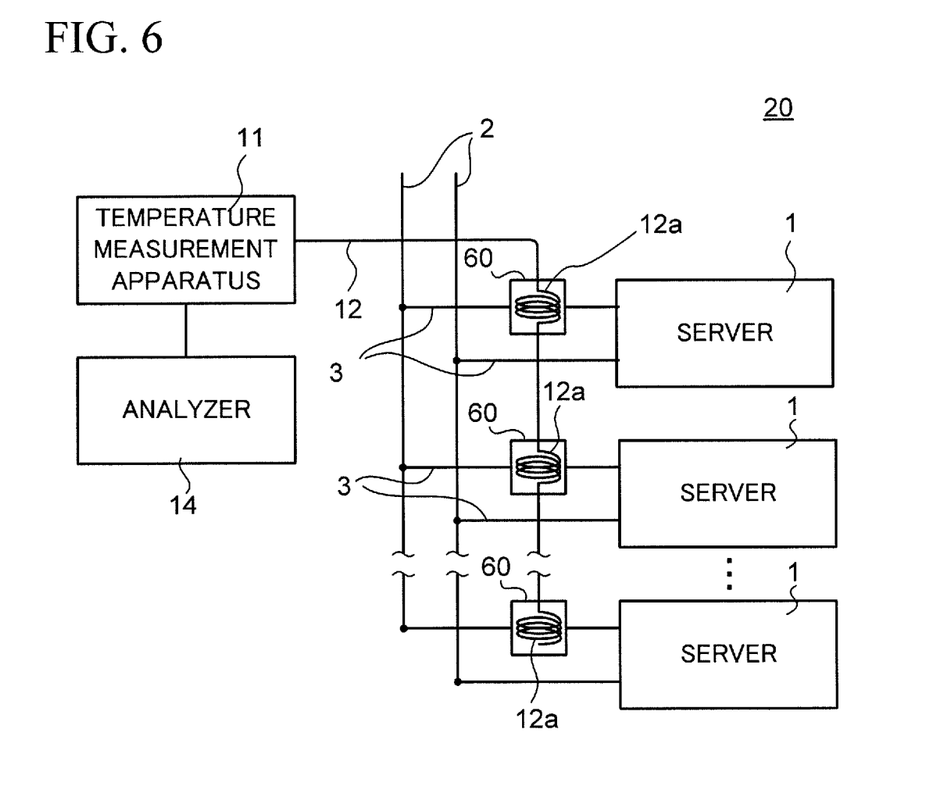
FIG. 6 is a block diagram of a power measurement system according to a second embodiment.

FIG. 6 is a block diagram of a power measurement system according to a second embodiment. A difference between this embodiment and the first embodiment lies in a different structure of the power temperature converter. The rest of the configuration is basically the same as the first embodiment. For this reason, the constituents in FIG. 6 which are the same as those in FIG. 1 are denoted by the same reference numerals and detailed description thereof will be omitted.

In a power measurement system 20 of this embodiment, a power temperature converter 60 configured to generate heat by a current flowing through a power supply line 3 is attached to the power supply line 3 of each server 1. Meanwhile, an optical fiber 12 is installed in such a manner as to come into contact with each power temperature converter 60. Unlike the first embodiment, this embodiment does not use an optical fiber for measuring ambient temperatures.

Figure 7:
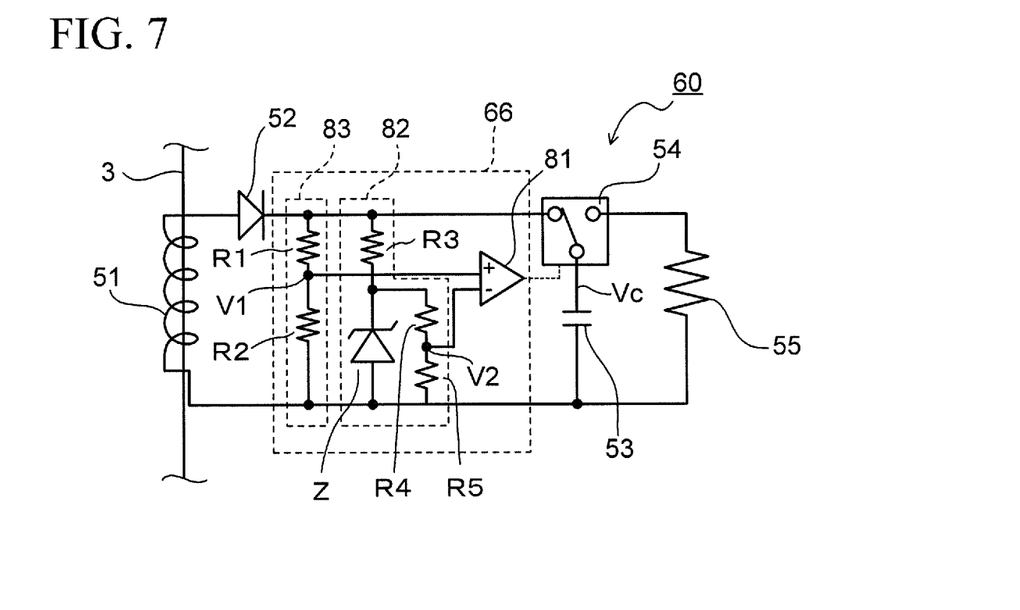
FIG. 7 is an equivalent circuit diagram of a power temperature converter of the second embodiment.

FIG. 7 is an equivalent circuit diagram of the power temperature converter 60. As depicted in FIG. 7, the power temperature converter 60 includes a current coil 51, a rectifier element 52, a capacitor 53, a switch element 54, a resistance heating element 55, and a discharge control unit 66.

The current coil 51 is attached to the power supply line 3 and generates an electromotive force corresponding to an AC current flowing through the power supply line 3 by the action of electromagnetic induction. The rectifier element 52 rectifies the electromotive force (the AC current) generated by the current coil 51. The current rectified by the rectifier element 52 is supplied to the capacitor 53 via the switch element 54, whereby charges are accumulated in the capacitor 53. The resistance heating element 55 is configured to generate heat when the charges accumulated in the capacitor 53 flow therein, and is formed of a nickel thin film, for example.

The discharge control unit 66 includes a comparator 81, a reference voltage generation circuit 82, and a voltage-dividing circuit 83. The voltage-dividing circuit 83 is formed of two resistor elements R1 and R2 connected in series, for example, and divides a voltage on two ends of the capacitor 53 in a proportion corresponding to resistance values of the two resistor elements R1 and R2. The voltage thus divided is then inputted to one of input terminals (a positive input terminal) of the comparator 81. In other words, a voltage V1 which varies depending on the amount of charges accumulated in the capacitor 53 is inputted to the one of input terminals of the comparator 81.

The reference voltage generation circuit 82 is formed of a Zener diode Z and a plurality of resistor elements R3 to R5, for example, and is configured to output a constant voltage (a reference voltage Vth) to the other input terminal (a negative input terminal) of the comparator 81 when a certain amount of charges are accumulated in the capacitor 53.

The comparator 81 compares the voltage V1 inputted to the positive input terminal with the reference voltage Vth inputted to the negative input terminal, and controls the switch element 54 in accordance with a result of comparison.

Here, the discharge control unit 66 may be formed by use of a one-chip microcontroller.

Figure 8:
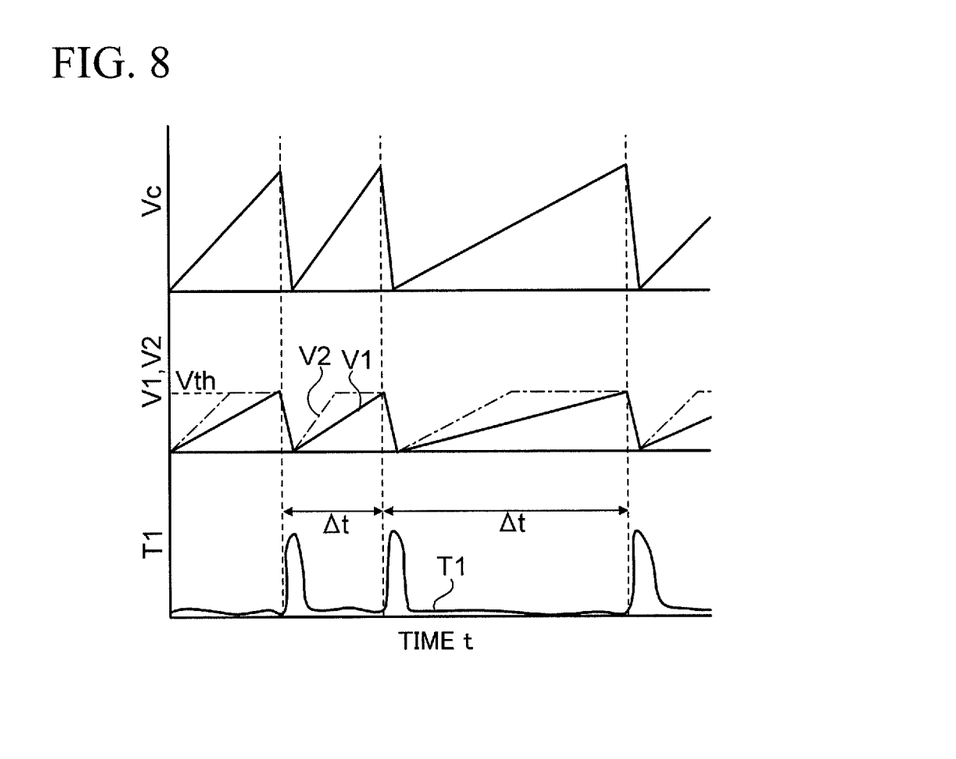
FIG. 8 is a timing chart for explaining an operation of the power temperature converter of the second embodiment.

FIG. 8 is a timing chart for explaining an operation of the power temperature converter 60. Note that a view on an upper side of FIG. 8 indicates a variation with time of a voltage Vc of the capacitor 53 and a view in the middle indicates a variation with time of an output voltage V1 from the voltage-dividing circuit 83 as well as a variation with time of an output voltage V2 from the reference voltage generation circuit 82. Meanwhile, a view on a lower side of FIG. 8 indicates a variation with time of a temperature T1 of the resistance heating element 55.

Here, in an initial state, the voltage Vc of the capacitor 53 is 0 V while output from the comparator 81 is "L", and the switch element 54 electrically connects the capacitor 53 to the current coil 51.

The voltage Vc of the capacitor 53 rises in accordance with an increase in the amount of charges accumulated in the capacitor 53. The larger the current (i.e., power consumption of the server 1) flowing through the power supply line 3 is, the faster a rate of the voltage rise of the capacitor 53 is.

The output voltage V2 (in a dashed line) from the reference voltage generation circuit 82 rises in accordance with the increase in the voltage Vc of the capacitor 53, and is then saturated at a certain voltage (the reference voltage Vth). On the other hand, the output voltage V1 from the voltage-dividing circuit 83 continues rising in accordance with the increase in the voltage Vc of the capacitor 53. Then, the output from the comparator 81 becomes "H" when the output voltage V1 from the voltage-dividing circuit 83 reaches the reference voltage Vth. Hence, the switch element 54 electrically disconnects the capacitor 53 from the current coil 51 and electrically connects the capacitor 53 to the heating element 55. Then, the charges accumulated in the capacitor 53 flow in the resistance heating element 55 and the temperature T1 of the resistance heating element 55 rises accordingly.

Thereafter, when the voltage Vc of the capacitor 53 drops due to the discharge, the output from the comparator 81 becomes "L", whereby the switch element 54 electrically disconnects the capacitor 53 from the resistance heating element 55 and electrically connects the capacitor 53 to the current coil 51. Hence, the capacitor 53 starts charging again. Thereafter, the charge and discharge of the capacitor 53 are repeated in a similar manner, and the temperature of the resistance heating element 55 rises every time the capacitor 53 performs the discharge.

In this embodiment, the larger the power consumption of the server 1 is, the faster the rise rate of the voltage Vc of the capacitor 53 is. The power temperature converter 60 therefore repeats the temperature rise at shorter time intervals $\Delta t$ as the power consumption of the server 1 becomes larger.

Figure 9:
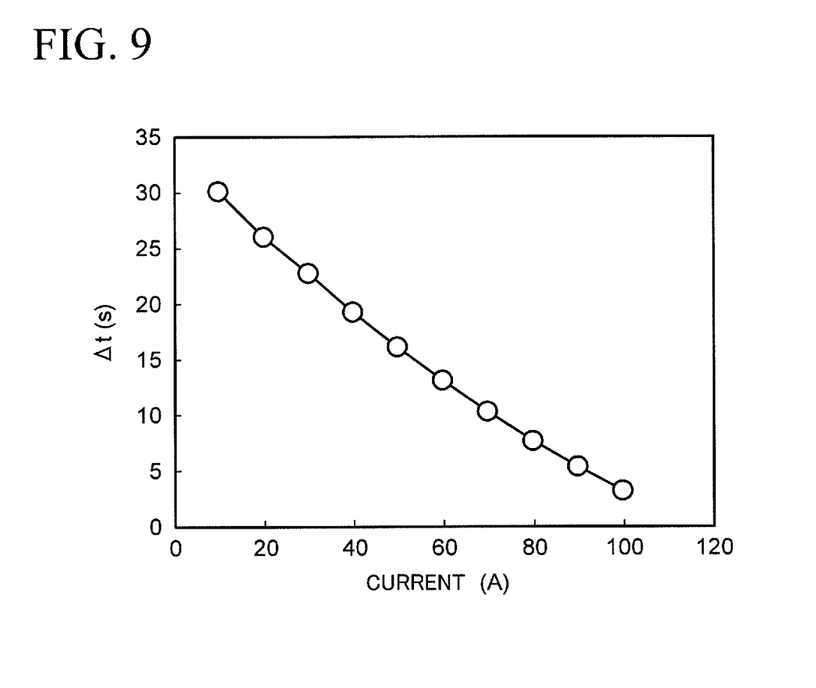
FIG. 9 is a view indicating a result of investigation of a relation between a current flowing through an electric instrument and a time interval $\Delta t$.

FIG. 9 is a view indicating a result of investigation of a relation between a current flowing through an electric instrument and the time interval $\Delta t$, with the current on the abscissa and the time interval $\Delta t$ on the ordinate. As indicated in FIG. 9, the larger the current flowing through the electric instrument is, the smaller the value of the time interval $\Delta t$ is.

Accordingly, power consumption of the server 1 may be found from the time interval $\Delta t$ by storing a calibration table, which is created from data as indicated in FIG. 9, in an analyzer 14 in advance.

This embodiment may also achieve similar effects to those of the first embodiment.

Third Embodiment

Figure 10:
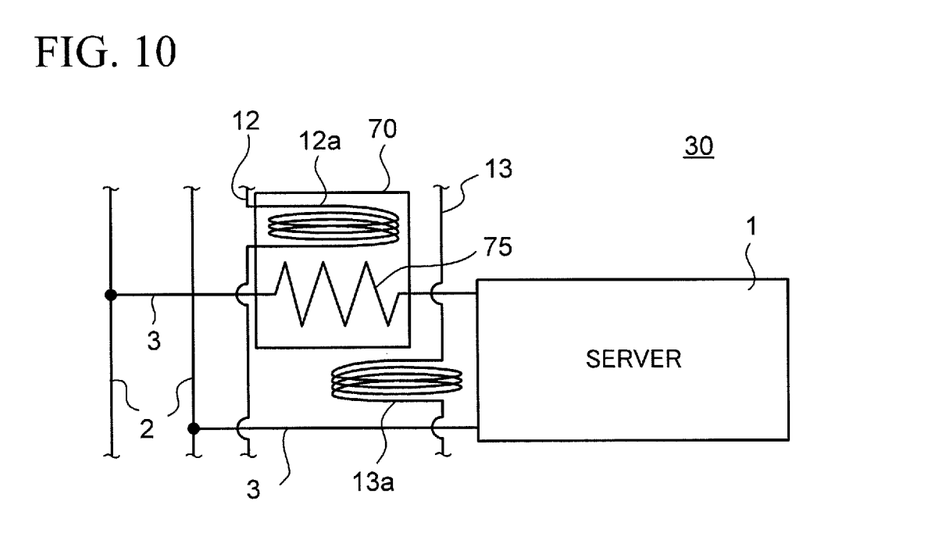
FIG. 10 is a schematic diagram for explaining a power measurement system according to a third embodiment.

FIG. 10 is a schematic diagram for explaining a power measurement system according to a third embodiment. A difference between the power measurement system of this embodiment and the power measurement system of the first embodiment lies in a different structure of the power temperature converter. The rest of the configuration is basically the same as the first embodiment and description of overlapping portions will therefore be omitted.

As depicted in FIG. 10, a power temperature converter 70 includes a resistance heating element (a shunt resistor) 75 which is connected in series with a power supply line 3. The resistance heating element 75 generates heat by a current flowing through the power supply line 3, and the temperature corresponds to the value of the current. As similar to the embodiment in FIG. 1, a power measurement system 30 of this embodiment measures the temperature of the power temperature converter 70 by using optical fibers 12 and 13, a temperature measurement apparatus (not depicted), and an analyzer (not depicted), and finds power consumption of each server 1 using a result of the measurement.

This embodiment may achieve effects similar to the first embodiment. Moreover, in this embodiment, the power consumption of each server 1 (an electric instrument) may be measured irrespective of whether the current flowing through the power supply line 3 is an AC current or a DC current.

The above-described embodiments have explained the case of using the resistance heating element as the temperature change element. Instead, a thermoelectric element such as a Peltier element may be used as the temperature change element. When a Peltier element is used, it may be also possible to realize a configuration in which the temperature drops in accordance with the current flowing through the power supply line 3. Here, power consumption of an electric instrument may also be calculated by using a temperature drop amount.

Meanwhile, the above-described embodiments have explained the case where the electric instrument is the server. However, it is needless to say that this does not intend to limit the electric instrument only to the server. For example, one rack housing a plurality of servers may be regarded as one electric instrument, or various other apparatus which consume electric power may be regarded as electric instruments.

All examples and conditional language recited herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A power measurement system, comprising:
    a power temperature converter attached to a power supply line of an electric instrument and having a temperature changed corresponding to a current flowing through the power supply line;
    a temperature measurement apparatus configured to measure the temperature of the power temperature converter; and
    an analyzer configured to analyze power consumed by the electric instrument by using a measurement result of the temperature of the power temperature converter obtained by the temperature measurement apparatus,
    wherein the power temperature converter includes:
        a coil attached to the power supply line of the electric instrument and configured to output a current having a size corresponding to the current flowing through the power supply line by electromagnetic induction;
        a rectifier element configured to rectify the current outputted from the coil;
        a capacitor configured to accumulate charges by being supplied the current rectified by the rectifier element to the capacitor;
        a temperature change element having a temperature changed by a current discharged from the capacitor;
        a switch element configured to switch a connection counterpart of the capacitor between the rectifier element and the temperature change element; and
        a discharge control unit configured to control the switch element.

2. The power measurement system according to claim 1, wherein the temperature measurement apparatus is configured to measure the temperature of the power temperature converter by using an optical fiber as a temperature sensor.

3. The power measurement system according to claim 1, wherein the temperature change element is a resistance heating element.

4. The power measurement system according to claim 1, wherein the discharge control unit switches the switch element at a regular time interval.

5. The power measurement system according to claim 1, wherein the discharge control unit causes the capacitor to discharge by switching the switch element every time a voltage of the capacitor reaches a predetermined voltage.

6. The power measurement system according to claim 1, wherein the analyzer finds power consumption of the electric instrument by using a temperature change amount of the power temperature converter measured by the temperature measurement apparatus.

7. The power measurement system according to claim 1, wherein the analyzer finds power consumption of the electric instrument by using a frequency of temperature changes of the power temperature converter.

8. The power measurement system according to claim 1, wherein the power temperature converter is driven by power supplied from the coil.

9. A power temperature converter comprising:
    a coil attached to a power supply line of an electric instrument and configured to generate a current having a size corresponding to a current flowing through the power supply line by electromagnetic induction;
    a rectifier element configured to rectify the current generated by the coil;
    a capacitor configured to accumulate charges by being supplied the current rectified by the rectifier element to the capacitor;
    a temperature change element having a temperature changed by a current discharged from the capacitor;
    a switch element configured to switch a connection counterpart of the capacitor between the rectifier element and the temperature change element; and
    a discharge control unit configured to control the switch element.

10. The power temperature converter according to claim 9, wherein the discharge control unit switches the switch element at a regular time interval.

11. The power temperature converter according to claim 9, wherein the discharge control unit causes the capacitor to discharge by switching the switch element every time a voltage of the capacitor reaches a predetermined voltage.

12. The power temperature converter according to claim 9, wherein the temperature change element is a resistance heating element.

* * * * *